United States Patent
Reinmuth et al.

(10) Patent No.: US 9,751,751 B2
(45) Date of Patent: Sep. 5, 2017

(54) MICROMECHANICAL COMPONENT AND METHOD FOR MANUFACTURING SAME

(71) Applicant: Robert Bosch GmbH, Stuttgart (DE)

(72) Inventors: Jochen Reinmuth, Reutlingen (DE); Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/734,791

(22) Filed: Jun. 9, 2015

(65) Prior Publication Data
US 2015/0360937 A1    Dec. 17, 2015

(30) Foreign Application Priority Data
Jun. 13, 2014  (DE) .................. 10 2014 211 333

(51) Int. Cl.
*B81B 7/00*    (2006.01)
(52) U.S. Cl.
CPC ............ *B81B 7/0038* (2013.01); *B81B 7/007* (2013.01); *B81B 2201/025* (2013.01); *B81B 2207/092* (2013.01)
(58) Field of Classification Search
CPC ............ B81B 7/0038; B81B 2207/092; B81B 2201/025; B81B 7/007; B81C 1/00285; B81C 1/00301
See application file for complete search history.

(56) References Cited

U.S. PATENT DOCUMENTS

| | | | | |
|---|---|---|---|---|
| 2009/0008728 A1* | 1/2009 | Fujii | ............... | B81B 7/007 257/415 |
| 2010/0025845 A1* | 2/2010 | Merz | ............... | B81B 7/0038 257/723 |
| 2013/0045558 A1* | 2/2013 | Palm | ............... | C23C 14/0617 438/57 |
| 2015/0137280 A1* | 5/2015 | Chu | ............... | B81B 7/0038 257/415 |
| 2016/0049918 A1* | 2/2016 | Moulard | ............... | B81B 7/0038 333/186 |
| 2016/0107882 A1* | 4/2016 | Cuzzocrea | ............... | B81C 1/00285 257/415 |

* cited by examiner

*Primary Examiner* — Benjamin Sandvik
*Assistant Examiner* — Farid Khan
(74) *Attorney, Agent, or Firm* — Norton Rose Fulbright US LLP; Gerard Messina

(57) ABSTRACT

A micromechanical component includes a sensor chip and a cap chip connected to the sensor chip. A cavity is formed between the sensor chip and the cap chip. The sensor chip has a movable element situated in the cavity. The cap chip has a wiring level containing an electrically conductive electrode. The cap chip has a getter element situated in the cavity.

10 Claims, 6 Drawing Sheets

MICROMECHANICAL COMPONENT AND METHOD FOR MANUFACTURING SAME

BACKGROUND OF THE INVENTION

1. Field of the Invention

The present invention relates to a micromechanical component as well as a method for manufacturing a micromechanical component.

2. Description of the Related Art

Micromechanical sensors for measuring accelerations and rotation rates are known from the related art. It is also known that acceleration sensors and rotation rate sensors may be designed as integrated components on a shared chip. Known acceleration and rotation rate sensors have movable elements which are enclosed in at least partially evacuated cavities. In the case of rotation rate sensors, it is desirable in particular to have a low cavity pressure. It is known that the cavities of rotation rate sensors may be provided with getter elements to achieve a low cavity pressure and to maintain it over the lifetime of the sensor element.

BRIEF SUMMARY OF THE INVENTION

One object of the present invention is to provide a micromechanical component. Another object of the present invention is to provide a method for manufacturing a micromechanical component.

A micromechanical component includes a sensor chip and a cap chip connected to the sensor chip. A cavity is formed between the sensor chip and the cap chip. The sensor chip has a movable element situated in the cavity. The cap chip has a wiring level including an electrically conductive electrode. The cap chip has a getter element situated in the cavity. The getter element in this micromechanical component may advantageously at least partially bind the gas present in the cavity and thereby ensure a low pressure in the cavity. The wiring level of the cap chip of the micromechanical component may advantageously be used for electrical contacting and controlling the sensor chip.

In one specific embodiment of the micromechanical component, the getter element is electrically conductively connected to the electrode. It is therefore advantageously possible to apply a defined electrical potential to the getter element. An uncontrolled interaction between the getter element and the movable element of the sensor chip is advantageously reduced or prevented in this way. The getter element may therefore be utilized even as a counter-electrode for control and/or detection of the movable element of the sensor chip.

In one specific embodiment of the micromechanical component, the getter element has a first section and a second section, which is electrically insulated with respect to the first section. The first section is electrically conductively connected to the electrode. The second section is electrically conductively connected to another electrode. Particularly flexible monitoring of an interaction between the getter element and the movable element is therefore advantageously possible. Furthermore, the getter element may advantageously be situated particularly close to the movable element.

In one specific embodiment of the micromechanical component, the getter element is situated at least partially opposite the movable element. The getter element may therefore advantageously be designed with a large area, which permits a high sorption power of the getter element.

In one specific embodiment of the micromechanical component, the cap chip has a stop element. The getter element is spaced a greater distance away from the movable element than is the stop element. This therefore advantageously prevents the movable element from striking against the getter element.

In one specific embodiment of the micromechanical component, the stop element is formed in an insulator level, which at least partially covers the wiring level. This advantageously yields a particularly simple design of the micromechanical component.

In one specific embodiment of the micromechanical component, the stop element is electrically conductive. The electrical potential applied to the stop element may therefore advantageously be the same as that applied to the movable element, so that force-free stop of the movable element at the stop element is enabled.

A method for manufacturing a micromechanical component includes steps for providing a sensor chip with a movable element, for providing a cap chip including a wiring level with an electrically conductive electrode, for arranging a getter element on the cap chip and for connecting the sensor chip to the cap chip in such a way that a cavity in which the movable element and the getter element are situated is formed between the sensor chip and the cap chip. In the micromechanical component obtainable by this method, the getter element may advantageously effectuate and maintain a low pressure in the cavity. The wiring level of the cap chip may advantageously be used for electrical contacting and controlling of the sensor chip of the micromechanical component obtainable by the method.

In one specific embodiment of the method, the getter element is situated in such a way that it is electrically conductively connected to the electrode. This advantageously makes it possible to apply a defined electrical potential to the getter element in the micromechanical component obtainable by this method, so that an uncontrolled electrical interaction between the getter element and the movable element of the sensor chip may be prevented.

One specific embodiment of the method includes an additional step for removing a portion of an additional wiring level and/or of an insulator level on a top side of the cap chip to form a recess. In the process, the getter element is situated in the recess. This advantageously makes it possible to arrange the getter element at a greater distance from the movable element. In addition, a stop element may advantageously be formed in the additional wiring level and/or the insulator level, advantageously preventing the movable element from striking against the getter element in the micromechanical component obtainable by this method.

DETAILED DESCRIPTION OF THE INVENTION

Figure 1:
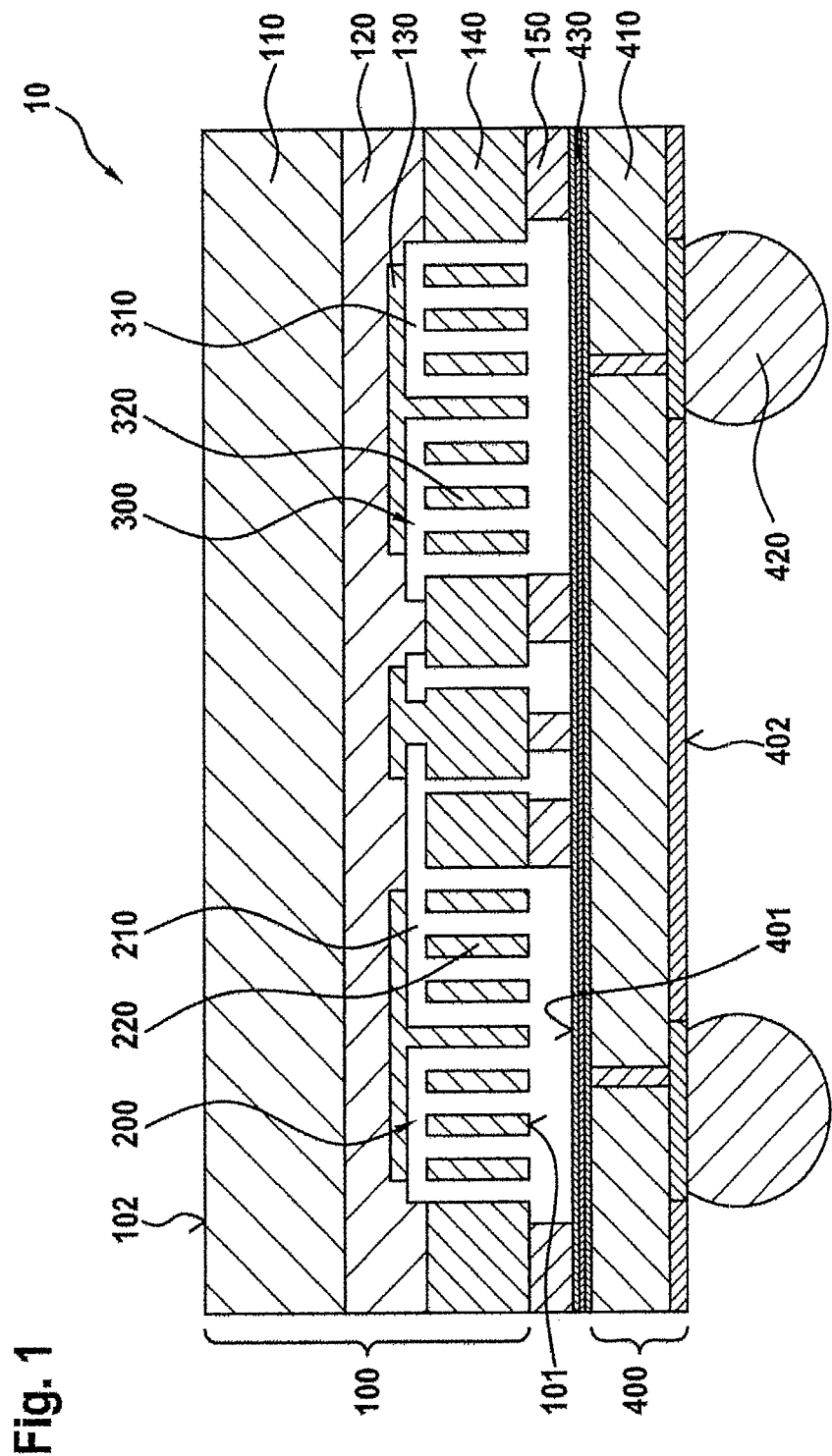
FIG. 1 shows a sectional side view of a micromechanical component.

FIG. 1 shows a schematic sectional side view of a micromechanical component 10. Micromechanical component 10 is a sensor element for measuring physical variables, in particular for measuring accelerations and/or rotation rates. Micromechanical component 10 is an integrated micromechanical component, in which a first sensor 200 and a second sensor 300 are integrated into a shared micromechanical component 10. Each sensor 200, 300 of micromechanical component 10 has movable micromechanical elements.

Micromechanical component 10 includes a micromechanical sensor chip (MEMS chip) 100 and a cap chip 400.

Sensor chip 100 has a top side 101 and a back side 102 opposite top side 101. Sensor chip 100 has a substrate 110, which is preferably designed as a silicon substrate and forms back side 102 of sensor chip 100. Multiple conductive and insulating layers, partially structured and interconnected, are situated in alternation on substrate 110. In the simplified representation in FIG. 1, two insulator levels 120, one conductive wiring level 130 and one conductive function level 140 are present. Function level 140 forms top side 101 of sensor chip 100. Insulator levels 120 may be formed as oxide layers, for example. Conductive layers 130, 140 may be designed as polycrystalline silicon layers, for example.

Cap chip 400 has a top side 401 and a back side 402 opposite top side 401. Cap chip 400 has at least one wiring level and may be designed as an application-specific integrated circuit (ASIC), for example. In this case, cap chip 400 is preferably manufactured by a CMOS process.

Cap chip 400 has a substrate 410, which is preferably designed as a silicon substrate. A metal oxide stack 430 including multiple alternating conductive layers and insulating layers forming top side 401 of cap chip 400 is situated on substrate 410. Contact elements 420, which provide electrical contacting of micromechanical component 10, are situated on back side 402 of cap chip 400, which is on the opposite side. Contact elements 420 may be designed as solder beads, for example. Contact elements 420 are electrically conductively connected, by vias 421 extending through substrate 410, to electrical circuits, which are integrated into cap chip 400, but are not shown in detail in FIG. 1.

Sensor chip 100 and cap chip 400 are interconnected via connections 150. Top side 401 of cap chip 400 faces top side 101 of sensor chip 100. Connections 150 may be designed as metallic wafer bond connections, for example. In particular, connections 150 may be designed as eutectic bond connections, for example, as eutectic bond connections of aluminum to germanium. However, connections 150 may also be eutectic copper-tin bond connections or thermocompressive connections, for example.

Connections 150 establish electrically conductive connections between cap chip 400 and sensor chip 100, which permit controlling and reading out of first sensor 200 and of second sensor 300 by the electrical circuits integrated into cap chip 400. Furthermore, connections 150 hermetically seal the cavities formed between top side 101 of sensor chip 100 and top side 401 of cap chip 400.

First sensor 200 may be designed as a rotation rate sensor, for example. First sensor 200 has a cavity 210 formed between top side 101 of sensor chip 100 and top side 401 of cap chip 400. A low pressure preferably prevails in cavity 210. A movable element 220 formed in function level 140 of sensor chip 100 is situated to be movable in cavity 210 of first sensor 200.

Second sensor 300 may be designed as an acceleration sensor 300, for example. Second sensor 300 has a cavity 310 formed between top side 101 of sensor chip 100 and top side 401 of cap chip 400. A low pressure preferably also prevails in cavity 310 of second sensor 300. However, the pressure in cavity 310 of second sensor 300 may be higher than the pressure in cavity 210 of first sensor 200. Second sensor 300 includes a movable element 320, which is formed in function level 140 of sensor chip 100 and is situated to be movable in cavity 310 of second sensor 300.

To permit the formation and maintenance of a low pressure in cavity 210 of first sensor 200, cap chip 400 has a getter element situated in cavity 210 but not shown in FIG. 1. Different options of designing and arranging the getter element are shown below in FIGS. 2 through 6. In each case, the getter element serves to capture gas molecules in cavity 210 of first sensor 200, for example, by direct chemical bonding or by sorption.

Figure 2:
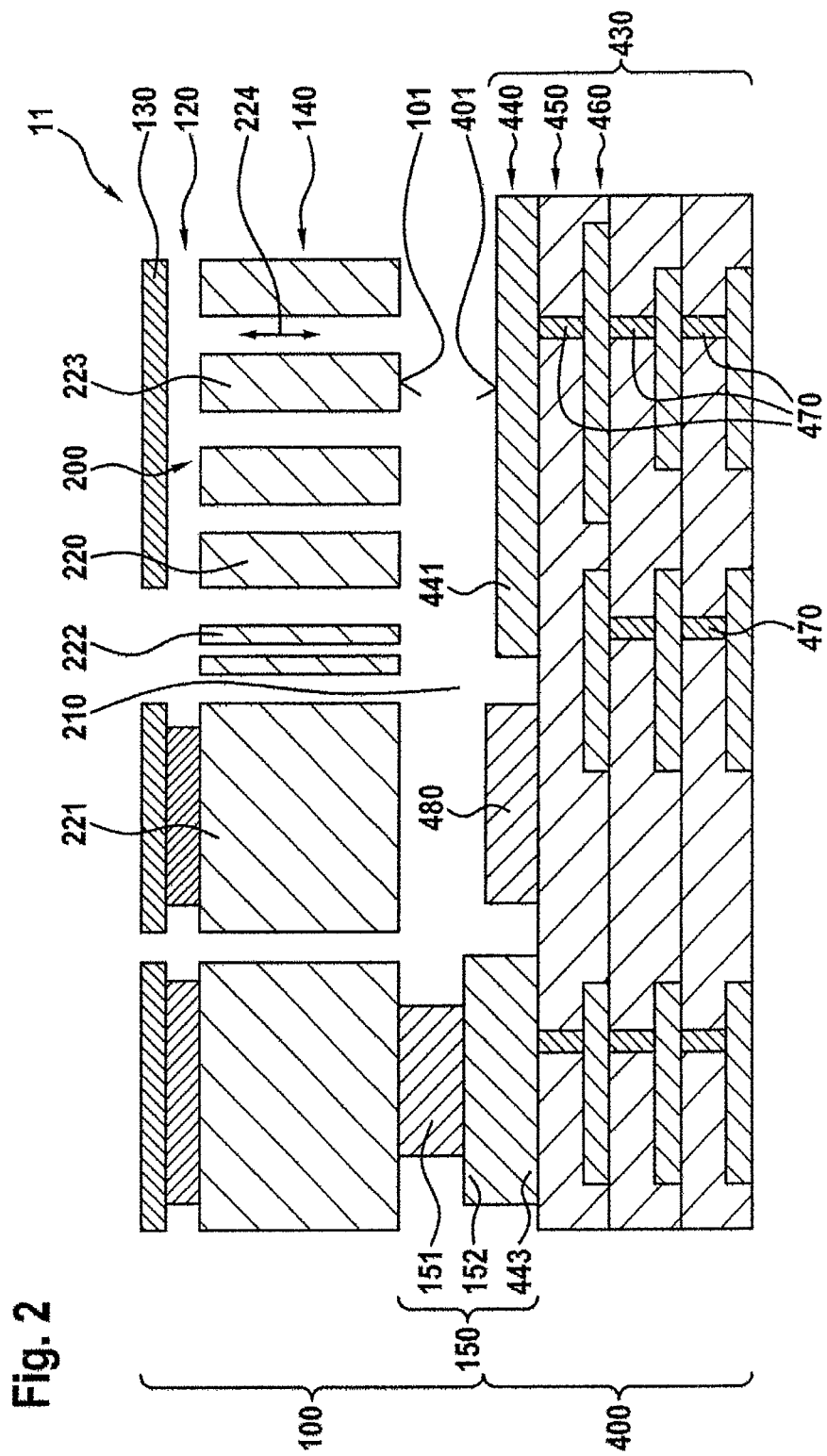
FIG. 2 shows a portion of a first micromechanical component.

FIG. 2 shows a schematic sectional side view of a portion of a micromechanical component 11. Micromechanical component 11 is designed like micromechanical component 10 in FIG. 1. FIG. 2 shows only a portion of micromechanical component 11 in the area of first sensor 200. FIG. 2 also shows details of movable element 220 of first sensor 200, which are not discernible in FIG. 1, additionally showing one of connections 150 between sensor chip 100 and cap chip 400 and of metal oxide stack 430 of cap chip 400, which are explained below.

Movable element 220 of first sensor 200 includes a seismic mass 223, which is situated in cavity 210, so that it is movable with respect to the other parts of sensor chip 100 and with respect to cap chip 400. Seismic mass 223 may be movable, for example, in a direction of movement 224 perpendicular to top side 101 of sensor chip 100 and to top side 401 of cap chip 400. However, it is also possible to design movable element 220 in such a way that seismic mass 223 is movable in another direction, for example, in a direction in parallel to top side 101 of sensor chip 100 and to top side 401 of cap chip 400. Seismic mass 223 is elastically connected to an anchor 221, which establishes a connection between seismic mass 223 and the other parts of sensor chip 100 via at least one spring element 222.

Metal oxide stack 430 of cap chip 400 includes a plurality of stacked wiring levels, the levels spaced a distance apart from one another through insulator levels. An uppermost wiring level 440 is situated at top side 401 of cap chip 400. Uppermost wiring level 440 may be a sixth wiring level of metal oxide stack 430, for example. Uppermost wiring level 440 is insulated by an uppermost insulator level 450 with respect to second-from-the-top wiring level 460 of metal oxide stack 430. Second-from-the-top wiring level 460 may be a fifth wiring level of metal oxide stack 430, for example. Wiring levels 440, 460 of metal oxide stack 430 may each be structured and subdivided into individual lateral sections. Individual sections of individual wiring levels 440, 460 may be interconnected electrically conductively by vias 470 extending through intermediate insulator levels.

Connection 150 between sensor chip 100 and cap chip 400, which is visible in FIG. 2, includes a spacer element 151 formed on sensor chip 100 and a eutectic connection between a first metallization 152 formed on spacer element 151 and a second metallization 443 formed on top side 401 of cap chip 400 in uppermost wiring level 440. First metallization 152 may contain germanium, for example. Second metallization 443 may contain aluminum or an aluminum-copper alloy, for example.

A first electrode 441 is formed on top side 401 of cap chip 400 in uppermost wiring level 440. First electrode 441 is situated in such a way that it is essentially opposite seismic mass 223 of movable element 220 of first sensor 200 in the direction perpendicular to top side 101 of sensor chip 100 and to top side 401 of cap chip 400. First electrode 441 may function as a controlling electrode and/or readout electrode for movable element 220 of first sensor 200.

In addition, cap chip 400 of micromechanical component 10 has on its top side 401 a getter element 480 situated in cavity 210 of first sensor 200. Getter element 480 is situated on top side 401 of cap chip 400 in a lateral area, in which uppermost wiring level 440 has been removed. Getter element 480 is thus situated at the side next to first electrode 441 on uppermost insulator level 450. Getter element 480 is electrically insulated with respect to first electrode 441 and all additional sections of uppermost wiring level 440.

Figure 3:
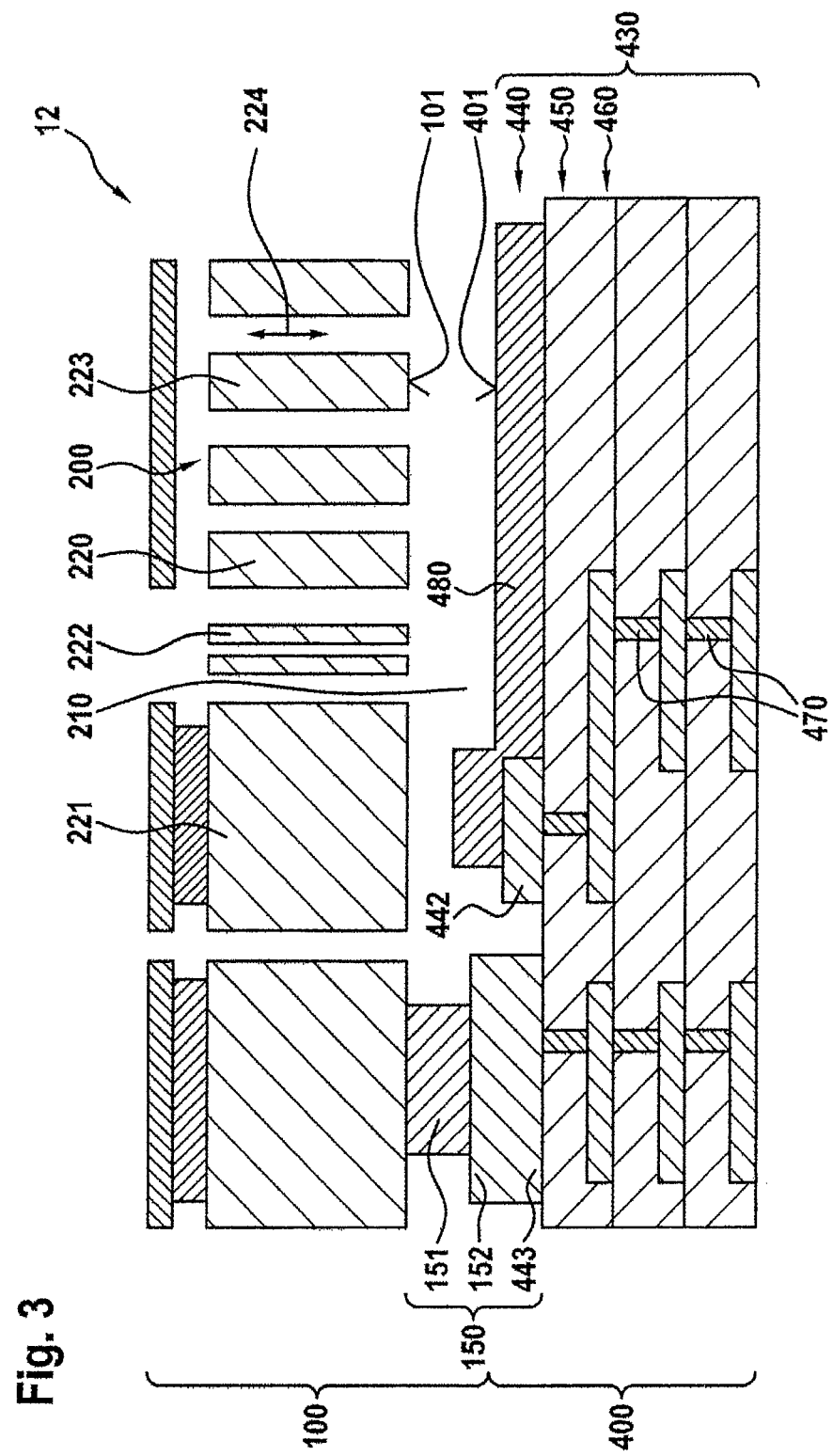
FIG. 3 shows a portion of a second micromechanical component.

FIG. 3 shows a schematic sectional side view of a portion of a micromechanical component 12, which is designed like micromechanical component 10, as shown in FIG. 1. FIG. 3 shows only a portion of micromechanical component 12 in the area of first sensor 200.

Micromechanical component 12 of FIG. 3 differs from micromechanical component 11 of FIG. 2 in that a second electrode 442, which is formed in uppermost wiring level 440, is situated on top side 401 of cap chip 400. Second electrode 442 is situated in a lateral area of top side 401 of cap chip 400, this cap chip being approximately opposite anchor 221 of movable element 220 of first sensor 200. First electrode 441 of micromechanical component 11 of FIG. 2 is not present in micromechanical component 12 of FIG. 3. Uppermost wiring level 440 of cap chip 400 has been removed from micromechanical component 12 in the lateral section of top side 401 of cap chip 400, which is opposite seismic mass 223 of movable element 220 of first sensor 200.

Getter element 480 in micromechanical component 12 extends over a lateral section of top side 401 of cap chip 400, in which uppermost wiring level 440 has been removed and borders uppermost insulator level 450 in this area. Furthermore, getter element 480 in micromechanical component 12 extends over at least a portion of second electrode 442. Thereby, getter element 480 is electrically conductively connected to second electrode 442. This makes it possible to apply a defined electrical potential to getter element 480 via second electrode 442. Thereby, getter element 480 may itself be utilized as an electrode, for example, for excitation and/or detection of a movement of movable element 220 of first sensor 200. Alternatively, the same electrical potential may be applied to getter element 480 as to movable element 220 of first sensor 200 to minimize an electrical interaction between getter element 480 and movable element 220 of first sensor 200. Another advantage of the arrangement of getter element 480 of micromechanical component 12 of FIG. 3 is that getter element 480 may be designed with a very large area, which permits a good pumping performance of getter element 480.

Figure 4:
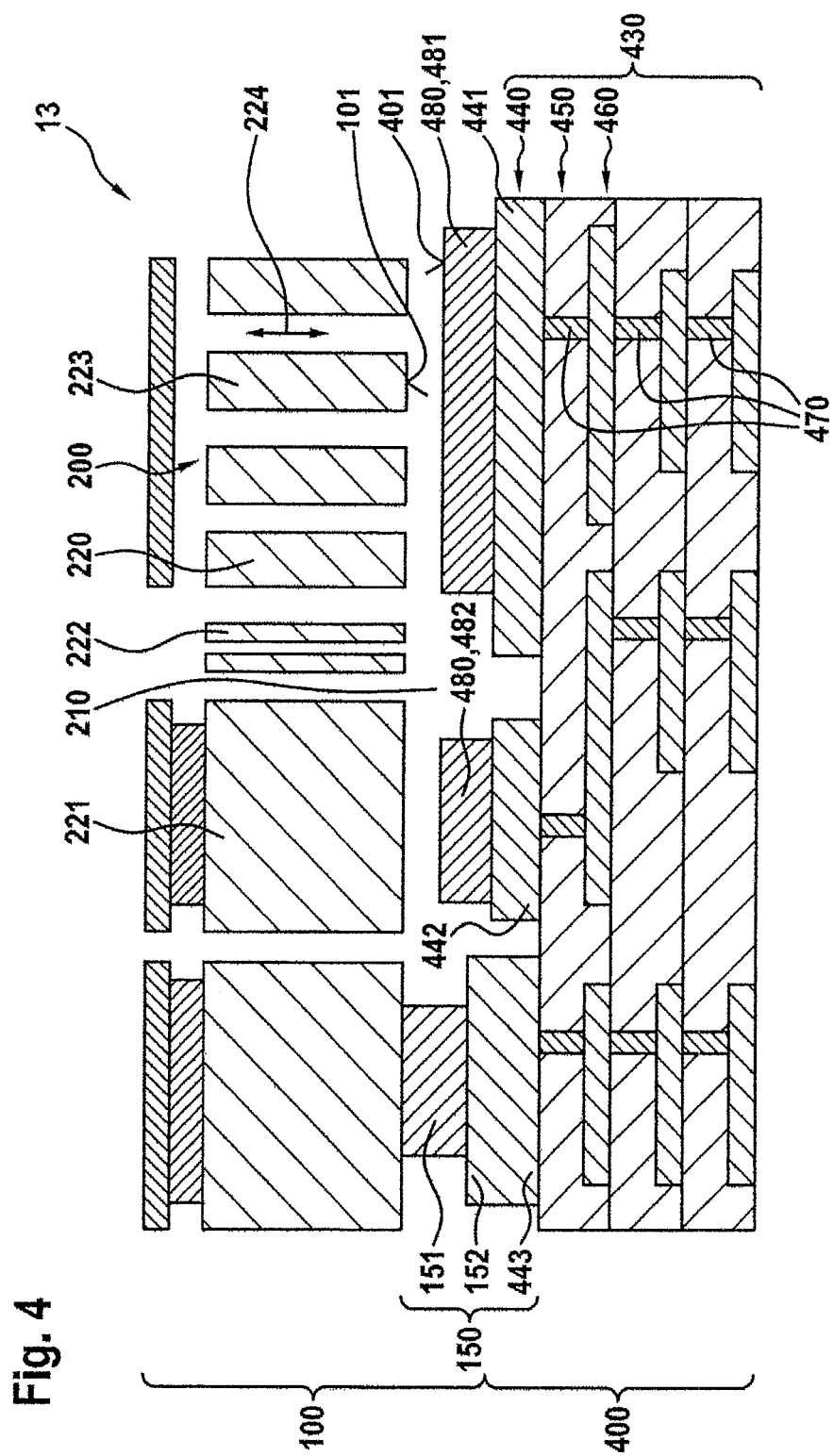
FIG. 4 shows a portion of a third micromechanical component.

FIG. 4 shows a schematic sectional view of a portion of a micromechanical component 13, which is designed like micromechanical component 10 of FIG. 1. FIG. 4 shows only one area of micromechanical component 13 surrounding first sensor 200.

In micromechanical component 13 of FIG. 4, both first electrode 441 and second electrode 442 are formed in uppermost wiring level 440 of cap chip 400. First electrode 441 is situated in a lateral section opposite seismic mass 223 of movable element 220 of first sensor 200 on top side 401 of cap chip 400. Second electrode 442 is situated in a lateral area of top side 401 of cap chip 400 opposite anchor 221 of movable element 220 of first sensor 200. First electrode 441 and second electrode 442 are electrically insulated from one another.

Getter element 480 in micromechanical component 13 of FIG. 4 has a first section 481 and a second section 482. First section 481 is situated at first electrode 441 and is electrically conductively connected to first electrode 441. Second section 482 of getter element 480 is situated at second electrode 442 and is electrically conductively connected to second electrode 442.

Electrical potentials are applied to both sections 481, 482 of getter element 480 of micromechanical component 13, separately from one another, via first electrode 441 and second electrode 442. This in turn makes it possible to establish a force-free state between movable element 220 of first sensor 200 and sections 481, 482 of getter element 480 or to use sections 481, 482 of getter element 480 as electrodes for controlling and/or reading out of movable element 220 of first sensor 200. In this case, sections 481, 482 of getter element 480 of micromechanical component 13 are a particularly short distance away from movable element 220 of first sensor 200, which may result in a strong interaction between sections 481, 482 of getter element 480 and movable element 220 of first sensor 200 and thus in high sensitivity. Another advantage of getter element 480 of micromechanical component 13 is that getter element 480 may be designed with a large area, which may enable getter element 480 to have a high pump performance.

Figure 5:
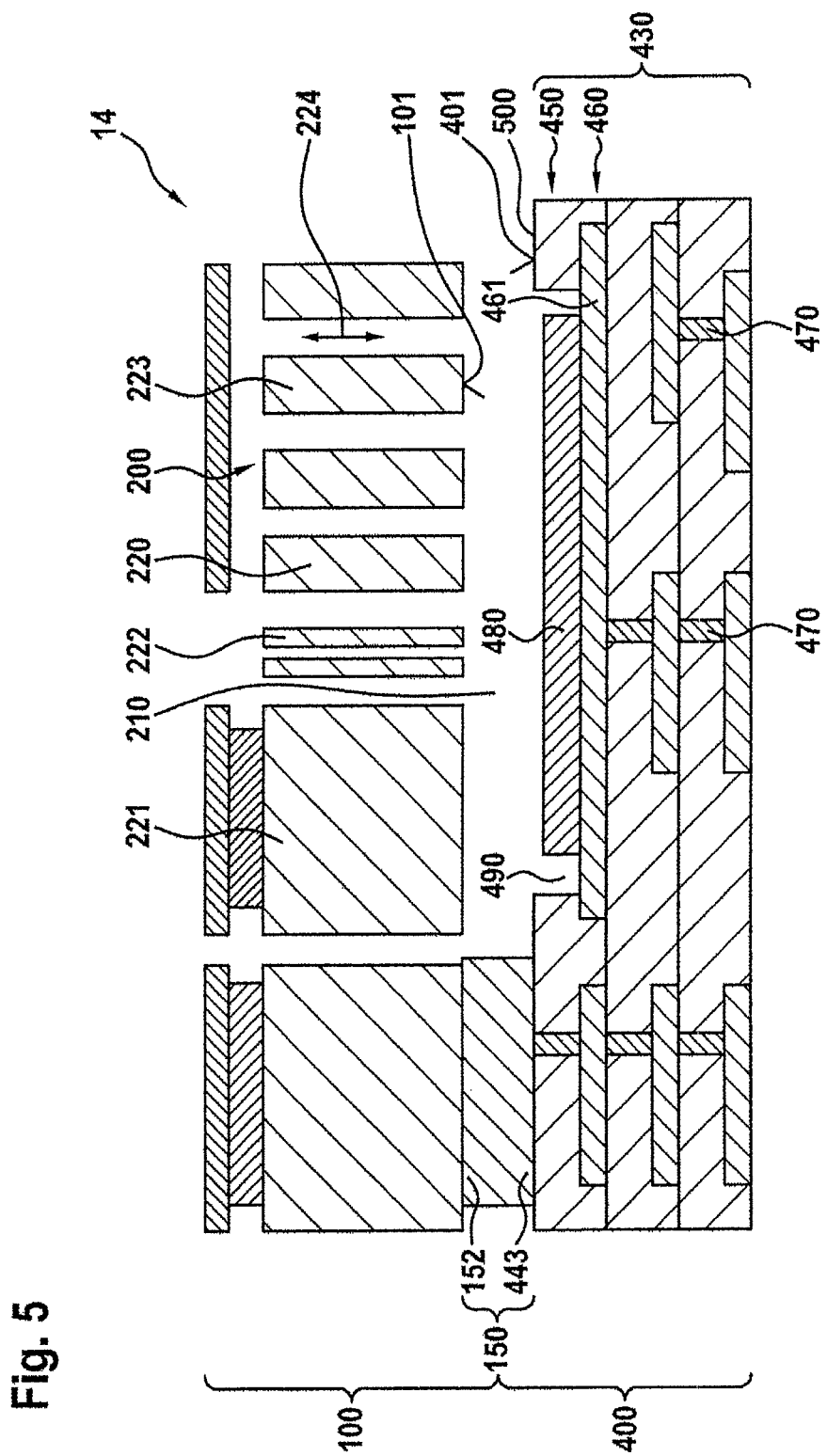
FIG. 5 shows a portion of a fourth micromechanical component.

FIG. 5 shows a schematic sectional side view of a micromechanical component 14, which is designed like micromechanical component 10 of FIG. 1. FIG. 5 shows only a portion of micromechanical component 14 in the area of first sensor 200.

With micromechanical component 14, in addition to a portion of uppermost wiring level 440, a portion of uppermost insulator level 450 has also been removed at top side 401 of cap chip 400, so that a portion of second-from-the-top wiring level 460 is exposed and forms a third electrode 461. A recess 490 is formed on top side 401 of cap chip 400 by the removal of a portion of uppermost insulator level 450. Third electrode 461 in second-from-the-top wiring level 460 is situated at the base of this recess 490.

In micromechanical component 14 of FIG. 5, getter element 480 is situated on third electrode 461 in recess 490 and is electrically conductively connected to third electrode 461. Third electrode 461 permits a defined electrical potential to be applied to getter element 480.

Getter element 480 has a smaller thickness in the direction perpendicular to top side 401 of cap chip 400 than uppermost insulator level 450. Getter element 480 is thereby situated completely inside of recess 490 and does not protrude beyond a section of uppermost insulator level 450 delimiting recess 490. This section of uppermost insulator level 450 delimiting recess 490 thus forms a stop element 500.

Both getter element 480 and stop element 500 are situated at least partially opposite seismic mass 223 of movable element 220 of first sensor 200 in the direction perpendicular to top side 101 of sensor chip 100 and to top side 401 of cap chip 400. The distance between seismic mass 223 and stop element 500 in the direction perpendicular to top side 101 of sensor chip 100 is less than the distance between seismic mass 223 and getter element 480. This advantageously prevents seismic mass 223 from striking unintentionally against getter element 480. Before a stop of seismic mass 223 at getter element 480 occurs, seismic mass 223 is already in contact with stop element 500.

Getter element 480 in micromechanical component 14 is a greater distance away from movable element 220 of first sensor 200 than is the case with micromechanical component 13 of FIG. 4. Therefore, there is less interaction between getter element 480 and movable element 220 of first sensor 200 in micromechanical component 14.

Figure 6:
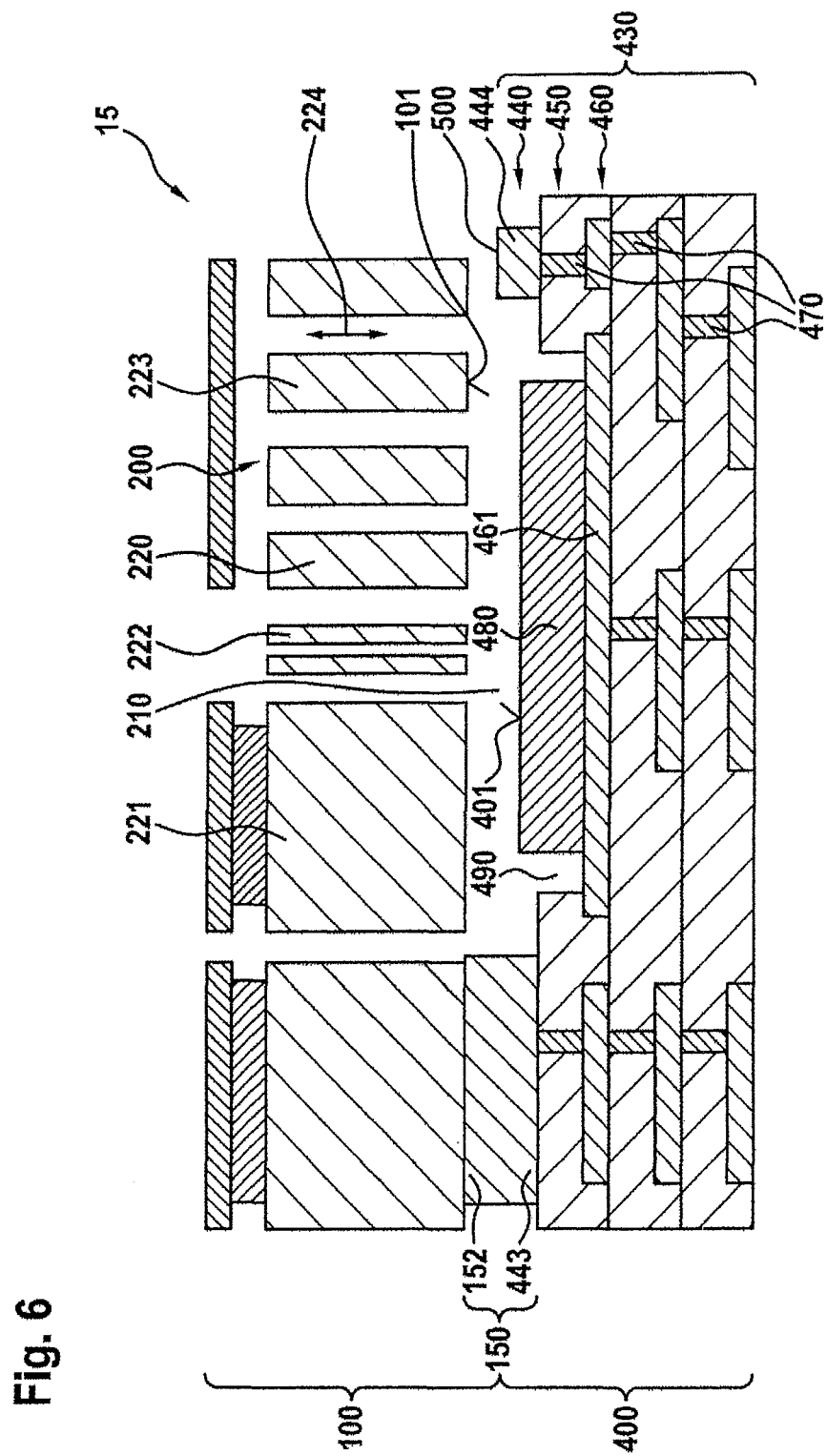
FIG. 6 shows a portion of a fifth micromechanical component.

FIG. 6 shows a schematic sectional side view of a micromechanical component 15, which is designed like micromechanical component 10 of FIG. 1. FIG. 6 shows only a portion of micromechanical component 15 in the area of first sensor 200.

With micromechanical component 15, as with micromechanical component 14 of FIG. 5, a portion of uppermost insulator level 450 of cap chip 400 has also been removed in addition to a portion of uppermost wiring level 440 of cap chip 200, so that recess 490 is formed. Third electrode 461 formed in second-from-the-top wiring level 460 is situated at the base of recess 490. Getter element 480 is in turn situated on third electrode 461 in recess 490 and is electrically conductively connected to third electrode 461.

In contrast with micromechanical component 14 of FIG. 5, getter element 480 in micromechanical component 15 of FIG. 6 has a greater thickness in the direction perpendicular to top side 401 of cap chip 400 than the thickness of uppermost insulator level 450. Getter element 480 therefore protrudes beyond uppermost insulator level 450.

A remaining portion of uppermost wiring level 400 [sic; 440] in micromechanical component 15 of FIG. 6 forms a fourth electrode 444 on a portion of uppermost insulator level 450 delimiting recess 490. Fourth electrode 444 is insulated with respect to third electrode 461 and getter element 480. Fourth electrode 444 and the portion of uppermost insulator level 450 delimiting recess 490 together form stop element 500.

In micromechanical component 15, getter element 480 and stop element 500 are both situated at least partially opposite movable element 220 of first sensor 200 in the direction perpendicular to top side 101 of sensor chip 100 and to top side 401 of cap chip 400. Fourth electrode 444 of stop element 500 is a smaller distance away from seismic mass 223 of movable element 220 of first sensor 200 than getter element 480. Thereby, in micromechanical component 15, seismic mass 223 of movable element 220 of first sensor 200 is prevented from striking against getter element 480.

The electrical potential, which may be applied to fourth electrode 444 of stop element 500 of micromechanical component 15, is the same as that applied to movable element 220 of first sensor 200. This allows a force-free stop of movable element 220 at stop element 500.

What is claimed is:

1. A micromechanical component, comprising:
    a sensor chip; and
    a cap chip connected to the sensor chip;
    wherein:
        a cavity is formed between the sensor chip and the cap chip,
        the sensor chip has a movable element situated in the cavity,
        the cap chip has a wiring level including an electrically conductive electrode,
        the cap chip has a getter element situated in the cavity,
        the getter element is electrically conductively connected to the electrode, and
        the getter element is configured to excite movement of the movable element.

2. The micromechanical component as recited in claim 1, wherein the getter element has a first section and a second section electrically insulated from one another, the first section being electrically conductively connected to the electrode, and the second section being electrically conductively connected to another electrode.

3. The micromechanical component as recited in claim 1, wherein the getter element is situated at least partially opposite the movable element in the cavity.

4. The micromechanical component as recited in claim 1, wherein the cap chip has a stop element, and wherein a distance of the getter element from the movable element is greater than a distance of the stop element from the movable element.

5. The micromechanical component as recited in claim 4, wherein the stop element is formed in an insulator level which at least partially covers the wiring level.

6. The micromechanical component as recited in claim 4, wherein the stop element is electrically conductive.

7. A method for manufacturing a micromechanical component, comprising:
    providing a sensor chip with a movable element;
    providing a cap chip with a wiring level, including an electrically conductive electrode;
    arranging a getter element on the cap chip; and
    connecting the sensor chip to the cap chip in such a way that a cavity is formed between the sensor chip and the cap chip, the movable element and the getter element being situated in the cavity, wherein the getter element is electrically conductively connected to the electrode, and wherein the getter element is configured to excite movement of the movable element.

8. The method as recited in claim 7, further comprising:
    removing a portion of at least one of another wiring level and an insulator level on the top side of the cap chip to form a recess, wherein the getter element is situated in the recess.

9. The micromechanical component as recited in claim 1, wherein the getter element is further configured to detect movement of the movable element.

10. The method of as recited in claim 7, wherein the getter element is further configured to detect movement of the movable element.

* * * * *